US 8,749,283 B2

(12) United States Patent
Wang et al.

(10) Patent No.: US 8,749,283 B2
(45) Date of Patent: Jun. 10, 2014

(54) PLL DUAL EDGE LOCK DETECTOR

(71) Applicant: Marvell World Trade Ltd., St. Michael (BB)

(72) Inventors: Xiaoyue Wang, Santa Clara, CA (US); Shafiq M. Jamal, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/100,274

(22) Filed: Dec. 9, 2013

(65) Prior Publication Data

US 2014/0097879 A1    Apr. 10, 2014

Related U.S. Application Data

(63) Continuation of application No. 13/950,427, filed on Jul. 25, 2013, now Pat. No. 8,624,642, which is a continuation of application No. 13/272,560, filed on Oct. 13, 2011, now Pat. No. 8,519,756.

(60) Provisional application No. 61/406,953, filed on Oct. 26, 2010.

(51) Int. Cl.
*H03L 7/18* (2006.01)
*H03L 7/093* (2006.01)

(52) U.S. Cl.
USPC .......................................... 327/156; 327/147

(58) Field of Classification Search
CPC .......... H03L 7/0891; H03L 7/18; H03L 7/093
USPC ................................ 327/147, 156
See application file for complete search history.

(56) References Cited

U.S. PATENT DOCUMENTS

| | | | |
|---|---|---|---|
| 6,130,566 A | 10/2000 | Yokomizo | |
| 7,394,322 B2 | 7/2008 | Beeson | |
| 7,456,661 B2 | 11/2008 | Schmidt | |
| 8,258,834 B2 * | 9/2012 | Xiu | 327/156 |
| 8,258,877 B2 * | 9/2012 | Goel et al. | 331/1 R |
| 8,519,756 B2 * | 8/2013 | Wang et al. | 327/156 |
| 8,624,642 B2 * | 1/2014 | Wang et al. | 327/156 |
| 2005/0162199 A1 * | 7/2005 | Green et al. | 327/156 |
| 2005/0238129 A1 * | 10/2005 | Ishida et al. | 375/376 |
| 2006/0076989 A1 * | 4/2006 | Culmer | 327/156 |
| 2008/0129352 A1 * | 6/2008 | Zhang | 327/157 |
| 2008/0150588 A1 * | 6/2008 | Lin | 327/12 |
| 2009/0256601 A1 * | 10/2009 | Zhang et al. | 327/156 |
| 2012/0098570 A1 * | 4/2012 | Wang et al. | 327/7 |
| 2012/0319747 A1 * | 12/2012 | Namdar-Mehdiabadi et al. | 327/149 |
| 2013/0003483 A1 * | 1/2013 | Vlasenko et al. | 365/230.02 |
| 2013/0099836 A1 * | 4/2013 | Shaeffer et al. | 327/148 |

OTHER PUBLICATIONS

PCT International Search Report, Application No. PCT/US11/056097, Jan. 30, 2012.

* cited by examiner

*Primary Examiner* — Adam Houston (57) ABSTRACT

A lock signal indicating that a target signal is in phase with a reference signal includes detecting the reference signal at the rising and falling edges of the target signal. The target signal is detected on the rising and falling edges of the reference signal. An out of phase condition between the target and reference signals is used to place a timing means in a reset state. When the timing means is allowed to time out, a signal is asserted which indicates that the target signal is deemed to be locked to the reference signal.

20 Claims, 11 Drawing Sheets

PLL DUAL EDGE LOCK DETECTOR

CROSS REFERENCE TO RELATED APPLICATIONS

This application is a continuation of U.S. patent application Ser. No. 13/950,427, filed Jul. 25, 2013 (currently pending), which is a continuation of U.S. patent application Ser. No. 13/272,560, filed Oct. 13, 2011 (now U.S. Pat. No. 8,519,756, which claims priority to U.S. Provisional App. No. 61/406,953 filed Oct. 26, 2010, each of which is incorporated herein by reference herein in its entirety for all purposes.

BACKGROUND

The present disclosure relates to phase locked loop (PLL) circuits and in particular to circuitry for detecting when the output of the PLL has locked onto a reference signal.

Unless otherwise indicated herein, the approaches described in this section are not prior art to the claims in this application and are not admitted to be prior art by inclusion in this section.

Phase locked loops (PPLs) are widely used in communications electronics and digital electronics. In wireless products, PLLs are typically used to generate high speed system clocks. When the electronics for a PLL are powered up, it can take on the order of tens of microseconds for the frequency of the PLL output signal to become stable. A lock detector circuit is typically provided to detect when the frequency of the PLL output signal has settled. The lock detector can generate a lock signal that can be used by the system for clock gating.

Figure 1:
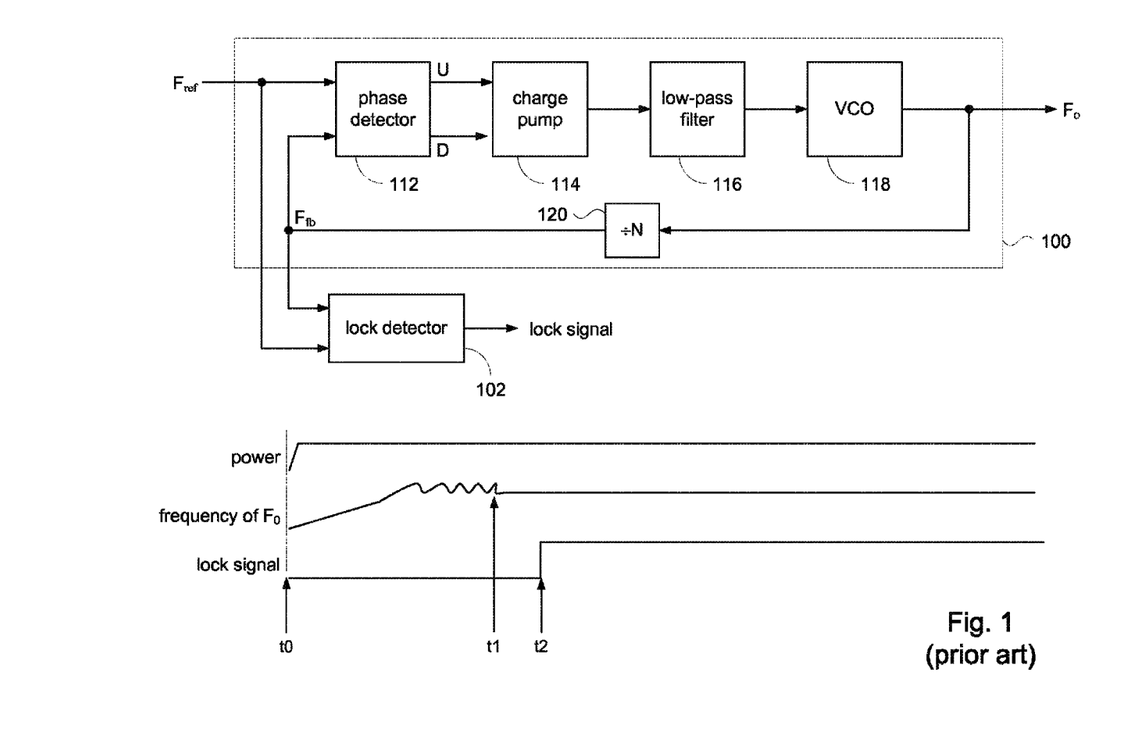
FIGS. 1 and 2 show a prior art lock detector.

A typical PLL circuit configuration is illustrated in FIG. 1. The main blocks of a PLL circuit 100 typically include a phase frequency detector 112, a charge pump 114, a low-pass filter 116, a voltage controlled oscillator (VCO) 118, and a feedback counter 120. The phase frequency detector 112 detects the difference in phase and frequency between a reference signal (clock) $F_{ref}$ and a feedback signal (clock) $F_{fb}$, and generates an "up" (U) or a "down" (D) control signal based on whether the frequency of the feedback signal $F_{fb}$ (feedback frequency) is lagging or leading the frequency of the reference signal $F_{ref}$ (reference frequency).

The phase frequency detector 112 outputs these "up" and "down" signals to the charge pump 114. If the charge pump receives an "up" signal, current is driven into the low-pass filter 116. Conversely, if the charge pump 114 receives a "down" signal, current is drawn from the low-pass filter 116. The low-pass filter 116 converts these signals to a control voltage (a DC level) that is used to control the VCO 118.

Based on the control voltage, a PLL output signal $F_o$ of the VCO 118 oscillates at a higher or lower frequency, which affects the phase and frequency of the feedback signal $F_{fb}$. Thus, if the phase detector 112 produces an "up"s signal, then the frequency of PLL output signal $F_o$ increases. A "down" signal decreases the frequency of the PLL output signal $F_o$. The output of the VCO 118 stabilizes once the reference signal $F_{ref}$ and the feedback signal $F_{fb}$ have the same phase and frequency. When the reference signal $F_{ref}$ and the feedback signal $F_{fb}$ are aligned, the PLL output signal $F_o$ is referred to variously as "locked," "locked to the reference signal," and the like.

A divide-by-N counter 120 may be inserted in the feedback loop to increase an amplitude of the PLL output signal $F_o$ above the reference signal $F_{ref}$. The PLL output signal $F_o$ is equal to N times the reference signal $F_{ref}$.

A lock detector 102 compares the reference signal $F_{ref}$ and the feedback signal $F_{fb}$ to determine when a lock condition has occurred. A lock signal is output when the lock condition has occurred.

FIG. 1 further illustrates a simple timing chart. When power is applied to the circuitry at time t0, the frequency of the PLL output signal $F_o$ begins to increase. During a period of time between t0 and t1, the PLL frequency is not unstable and cannot be used by the system. At time t1, the PLL frequency has stabilized, but typically a period of time (t2−t1) is allowed to pass to ensure that the PLL output signal $F_o$ has fully settled. Accordingly, during the period of time between t0 and t2, the lock signal remains "LO". At time t2, the lock signal goes "HI" to signify that the PLL output signal $F_o$ is ready to clock the system logic.

Figure 2:
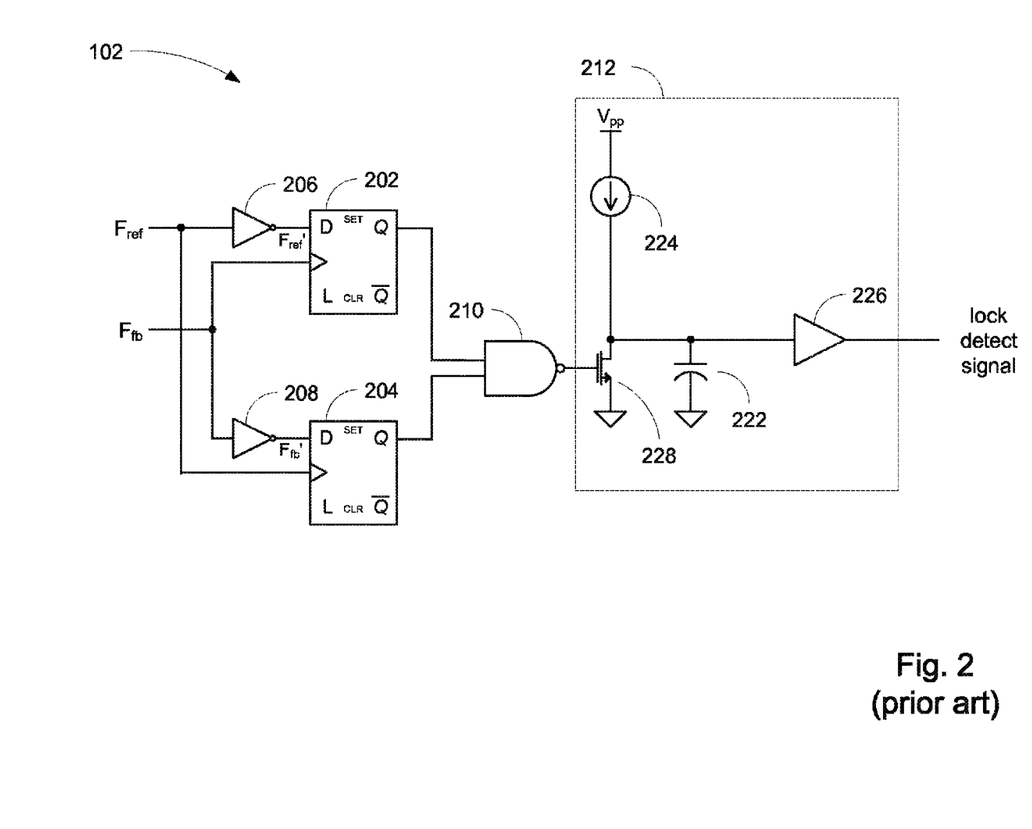

FIG. 2 illustrates a conventional implementation for the lock detector 102 which determines signal lock based on the rising edges of the reference signal $F_{ref}$ and the feedback signal $F_{fb}$. The lock detector comprises two flip flop circuits, such as the flip flops 202 and 204. The reference signal $F_{ref}$ is delayed by an inverted delay line 206, and the delayed signal $F_{ref}'$ feeds into the flip flop 202. The feedback signal $F_{fb}$ clocks the flip flop 202. Similarly for the flip flop 204, the feedback signal $F_{fb}$ is delayed by an inverted delay line 208, and the delayed signal $F_{fb}'$ feeds into the flip flop 204. The feedback signal $F_{ref}$ clocks the flip flop 204. The outputs of the flip flops 202 and 204 feed into NAND gate 210.

A timing circuit 212 comprises a capacitor 222 that is charged by a current source 224. So long as transistor 228 remains in the OFF condition, then after a certain amount of time proportional to L/C, where I is the current and C is the capacitance, the capacitor 222 will charge to a voltage level (i.e., a threshold voltage level) sufficient to trigger a buffer 228 and output a signal that constitutes the lock detect signal. The transistor 228 is controlled by the output of the NAND gate 210. During power up, the phase between the reference signal $F_{ref}$ and the feedback signal $F_{fb}$ will vary until the feedback signal attains a lock with the reference signal.

Figure 3:
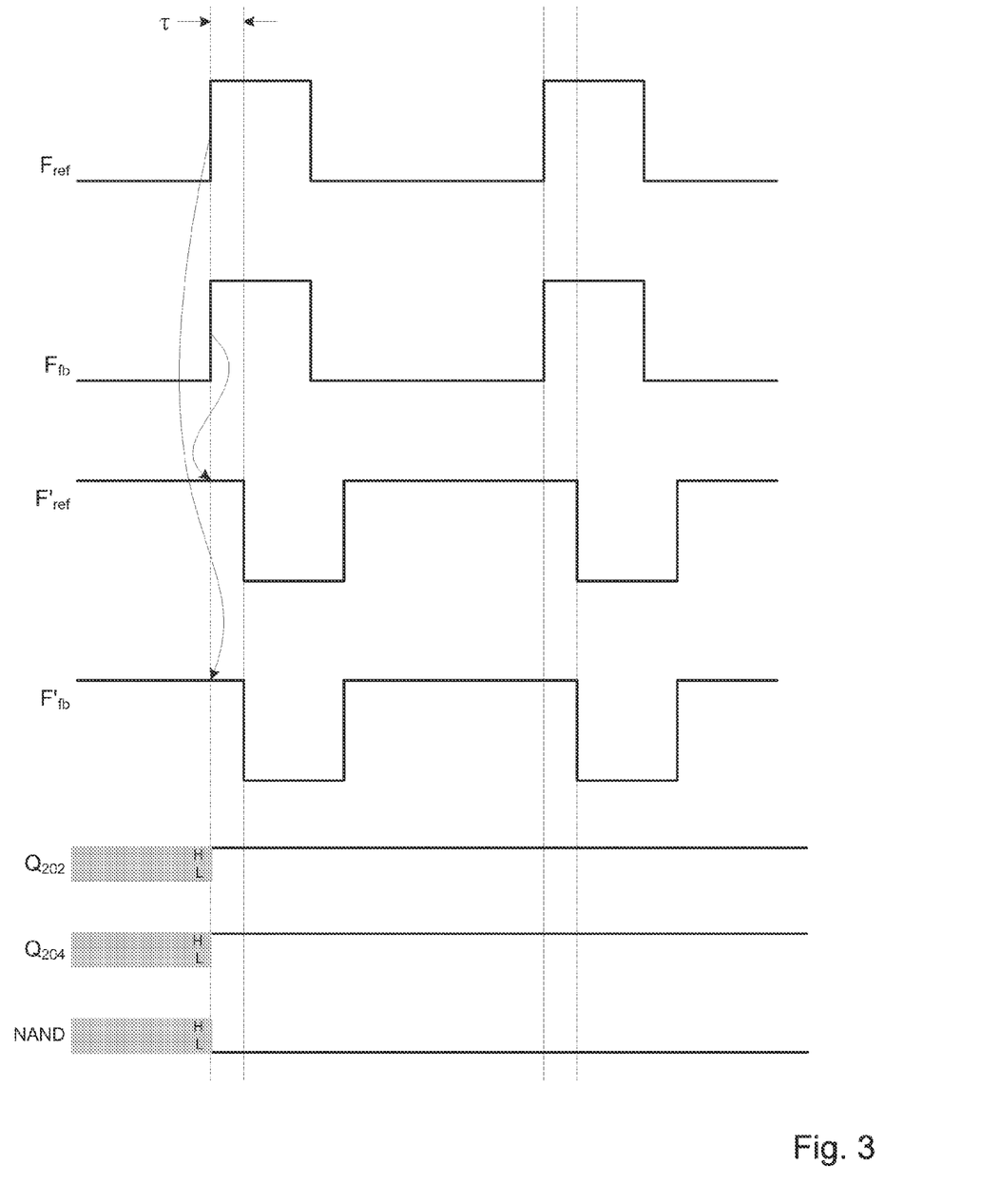
FIGS. 3-5 illustrate timing charts based on the prior art lock detector.

Referring to FIG. 3, a timing diagram of the reference signal $F_{ref}$ and the feedback signal $F_{fb}$ is illustrated for the lock condition. In this and subsequent figures, the shaded areas in the timing diagrams represent prior output states ("HI" or "LO") that depend on the previous phase relation of the signals $F_{ref}$ and $F_{fb}$. The flip flops 202 and 204 shown in FIG. 2 are clocked on the rising edges of $F_{fb}$ and $F_{ref}$ respectively. Accordingly, the flip flops will latch respective inverted signals $F_{ref}'$ and $F_{fb}'$ delayed by τ (the propagation delay of inverted delay lines 206 and 208). As can be seen, in the lock condition depicted in FIG. 3, the rising edges of the reference signal $F_{ref}$ and the feedback signal $F_{fb}$ are aligned. The flip flop outputs $Q_{202}$ and $Q_{204}$ are "HI", and consequently the output of NAND gate 210 is "LO". Thus, the transistor 228 is OFF and will remain in the OFF state so long as the lock condition exists, allowing the capacitor 222 to continue charging and the lock detect signal asserted.

Figure 4:
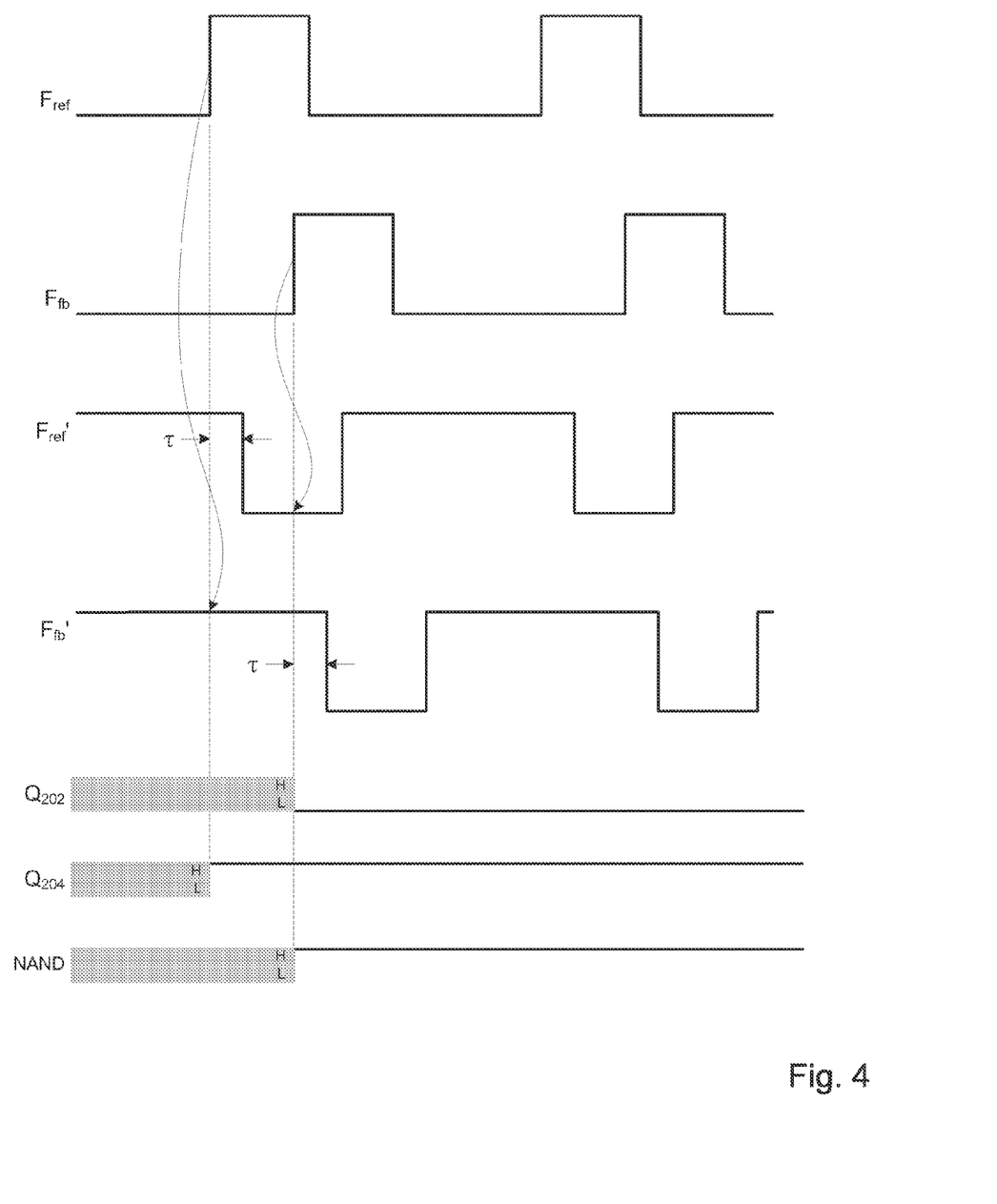

Referring to FIG. 4, a timing diagram is illustrated for a "no lock" condition where the reference signal $F_{ref}$ and the feedback signal $F_{fb}$ are not in phase. The timing diagram shows that the output of flip flop 202 is "LO" because of the timing of the rising edge of $F_{fb}$ relative to the inverted and delayed reference signal $F_{ref}'$. Accordingly, the NAND gate 210 is "HI" for this condition. The transistor 228 is turned ON and consequently the capacitor 222 does not charge.

Figure 5:
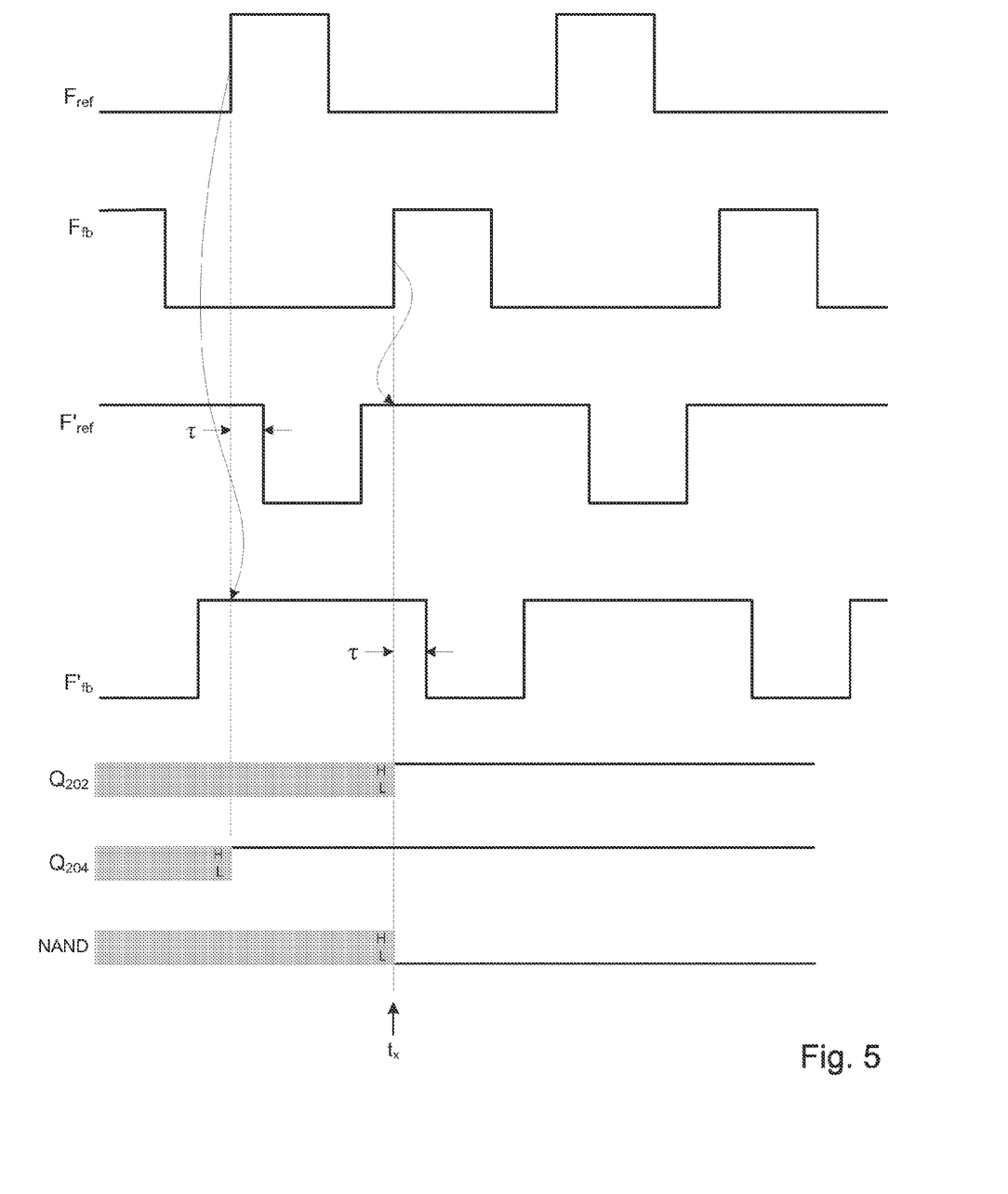

Referring to FIG. 5, a timing diagram is illustrated for a "no lock" condition, where the phase relation between the reference signal $F_{ref}$ and the feedback signal $F_{fb}$ create a condition at time $t_x$ that causes the NAND gate 210 to incorrectly outputs a "LO" logic level. The "LO" output of the NAND gate 210 turns OFF the transistor 228, allowing the capacitor 222 to charge and the lock detect signal to erroneously assert.

SUMMARY

In some embodiments, a circuit includes inputs for receiving a reference signal and a target signal. The circuit includes first circuitry to output first levels of the reference signal taken at the rising and falling edges of the target signal. Second circuitry outputs second levels of the target signal taken at the rising and falling edges of the reference signal. Third circuitry asserts a third level when the first and second levels indicate that the target signal is not in phase with the reference signal.

In some embodiments, fourth circuitry outputs a fourth signal after an amount of time has passed, and is operative to be reset in response to occurrence of the third level. The fourth circuitry may include a counter that includes a reset input connected to the third circuitry. In other embodiments, the fourth circuitry may include a current source, a transistor, and a capacitor. The capacitor is charged by a current from the current source, and can be discharged by the transistor. In other embodiments, the fourth circuitry may include a digital processing unit executing firmware.

In some embodiments, the first circuitry includes a delay element to output a delayed reference signal, wherein the first levels are based on the delayed reference signal. In some embodiments, the second circuitry includes a delay element output a delayed target signal, wherein the third and fourth levels are based on the delayed target signal.

In an embodiment, the circuit further includes a phase locked loop (PLL) circuit having an input to receive the reference signal and having a PLL feedback signal based on an output of the PLL circuit, wherein the PLL feedback signal is the target signal.

In some embodiments, a method of operating a circuit includes receiving a reference signal and receiving a target signal. First levels of the reference signal are generated at the rising and falling edges of the target signal. Second levels of the target signal are generated at the rising and falling edges of the reference signal. An operation is performed which includes asserting a lock signal after an amount of time has passed. The operation is restarted when the first and second levels indicate that the target signal is not in phase with the reference signal.

DETAILED DESCRIPTION

In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

A lock detector circuit in accordance with principles of the present disclosure can provide an indication of a lock condition between a reference signal and a target signal. In some embodiments, the reference signal may be a reference signal in a phase locked loop (PLL) circuit and the target signal may be a feedback signal in a feedback loop of the PLL circuit. An example of a PLL circuit is illustrated in FIG. 1. The lock detector circuit in accordance with principles of the present disclosure, however, can be used in any circuitry where it is desired to determine if one signal (e.g., the target signal) has achieved a lock with another signal (e.g., the reference signal).

Figure 6:
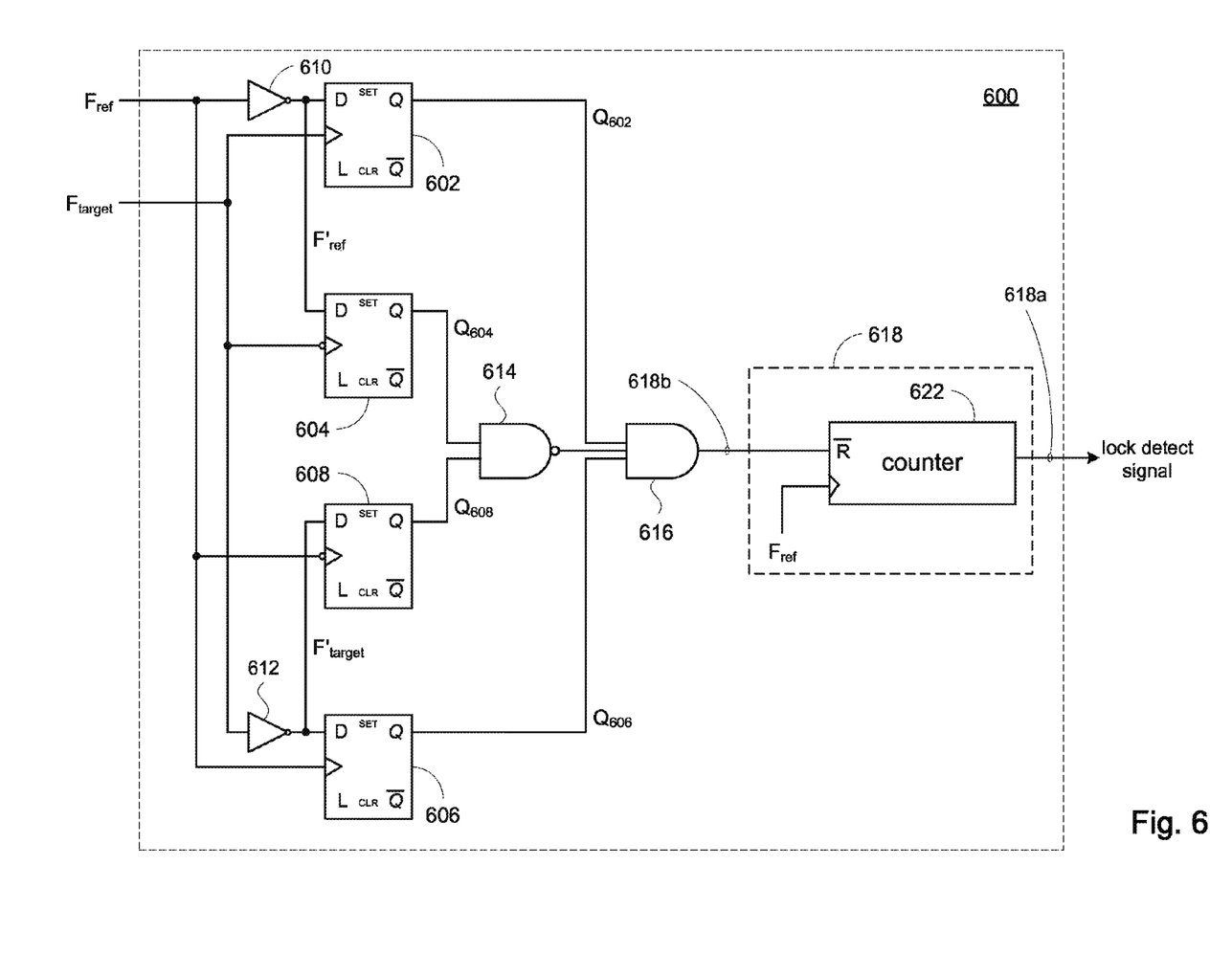
FIG. 6 shows an illustrative embodiment of a lock detector in accordance with principles of the present disclosure.

Referring to FIG. 6, in some embodiments, a lock detector 600 may comprises flip flops 602, 604, 606, and 608. As will become clear later on, the flip flops 602 and 604 constitute a dual edge-triggered detector. Similarly, flip flops 606 and 608 also constitute a dual edge-triggered detector. In the particular embodiment shown in FIG. 6, the flip flops 602, 604, 606, and 608 are D-type flip flops. It will be appreciated, however, that other types of flip flops may be substituted.

The lock detector 600 receives a reference signal $F_{ref}$ and a target signal $F_{target}$, and may output a lock detect signal. The reference signal $F_{ref}$ feeds into an inverted delay line 610. The inverted delay line 610 is associated with a propagation delay $\tau$. The output of the inverted delay line 610 is an inverted signal $F_{ref}'$, which is delayed relative to the incoming reference signal $F_{ref}$ by an amount based on the propagation delay $\tau$. The inverted signal $F_{ref}'$ feeds into flip flops 602 and 604. The flip flops 602 and 604 are clocked by the target signal $F_{target}$. In particular, the flip flop 602 is configured with a non-inverting clock input, and thus is triggered by the rising edges of the target signal $F_{target}$; while the flip flop 604 is configured with an inverting clock input, and so is triggered on the falling edges of the target signal.

The target signal $F_{target}$ feeds into an inverter 612 for detection, in addition to serving as a trigger. In some embodiments, the inverter 612 may have substantially the same propagation delay $\tau$ as inverter 610. The output of the inverter 612 is an inverted signal $F_{target}'$, which is delayed relative to the incoming target signal $F_{target}$ by an amount proportional to $\tau$. The inverted signal $F_{target}'$ feeds into flip flops 606 and 608. The flip flops 606 and 608 are clocked by the reference signal $F_{ref}$. The flip flop 606 is configured with a non-inverting clock input, and thus is triggered on the rising edges of the reference signal $F_{ref}$. The flip flop 608 is configured with an inverting clock input, and thus is triggered on the falling edges of the reference signal $F_{ref}$.

It can be appreciated that any suitable means for detecting and holding a level of the reference signal $F_{ref}$ in synchrony with the rising edge and falling edge of the target signal $F_{target}$ may be used in place of the flip flops 602 and 604. Likewise, any suitable means for detecting and holding a level of the target signal $F_{target}$ in synchrony with the rising edge and falling edge of the reference signal $F_{ref}$ may be used in place of the flip flops 606 and 608.

In some embodiments, the lock detector 600 may further include a NAND gate 614 for receiving outputs $Q_{604}$ and $Q_{608}$ of respective flip flops 604 and 608. An output of NAND gate 614 feeds into an input of an AND gate 616. The outputs $Q_{604}$ and $Q_{608}$ represent levels, respectively, of the inverted and delayed signals $F_{ref}'$ and $F_{target}'$ detected on the falling edges of signals $F_{target}$ and $F_{ref}$, respectively.

The AND gate 616 receives input from flip flops 602 and 606, in addition to input from NAND gate 614. The output $Q_{602}$ from flip flop 602 and the output $Q_{606}$ from flip flop 606 feed into AND gate 616. The outputs $Q_{602}$ and $Q_{606}$ represent levels, respectively, of the inverted and delayed signals $F_{ref}'$ and $F_{target}'$ detected on the rising edges of signals $F_{target}$ and $F_{ref}$, respectively.

In some embodiments, the lock detector 600 may further include a timing circuit 618. The timing circuit 618 operates for a given amount of time T from an initial state, and then asserts a signal at an output 618a. The timing circuit 618 may include a reset line 618b that resets the timing circuit to the initial state, thus restarting the timing operation from that initial state. In some embodiments, the amount of time T may be configurable. The output of AND gate 616 is connected to the reset line 618b of the timing circuit 618.

In an embodiment, the timing circuit 618 may comprise a counter 622. For example, the counter 622 may count from an initial state of zero to some maximum count value. It will be appreciated that any of numerous implementations for a counter may be employed. An output of the counter 622 may serve as the output 618a of the timing circuit 618. For example, the output may be asserted when the counter has reached its maximum count value. The counter 622 includes a reset input $\overline{R}$ (the figure shows an inverting reset input) that is connected to the reset line 618b of the timing circuit 618, which in turn is connected to the output of AND gate 616. When the reset input $\overline{R}$ is asserted by the AND gate 616, the counter 622 resets to the initial state and restarts the counting sequence; e.g., starts counting from zero.

The counter 622 may be clocked using the reference signal $F_{ref}$ and may be configured to assert a signal at its output after a maximum count value has been reached. Accordingly, the counter 622 can be configured to run for a suitable amount of time T by appropriately configuring the maximum count value. In some embodiments, the maximum count value may be programmable and hence the amount of time T can be programmed. In other embodiments, the maximum count value may be a fixed value.

Figure 6A:
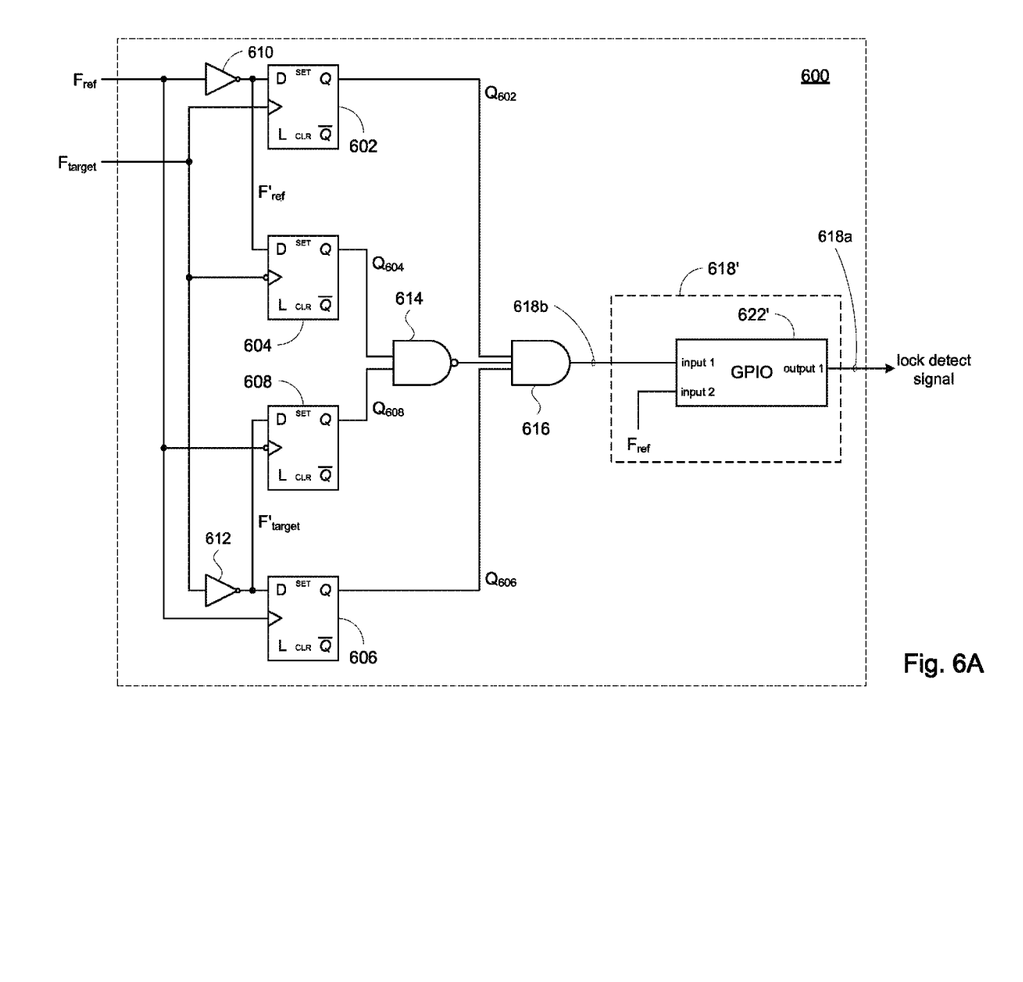
FIG. 6A illustrates the use of firmware for the timing circuitry.

Referring to FIG. 6A, in another embodiment, the lock detector 600 may employ a timing circuit 618' that is implemented with firmware comprising executable program code executing on a suitable digital processing unit 622', such as a general purpose IO (GPIO) processor. The reset line 618b and the reference signal $F_{ref}$ may be connected to input pins of the GPIO processor 622'. The output 618a may be connected to an output pin of the GPIO processor 622'. The firmware can be programmed to respond to signals on the input pins to output a signal on the output pin to behave in the same manner as discussed above for timing circuit 618 shown in FIG. 6.

Figure 7:
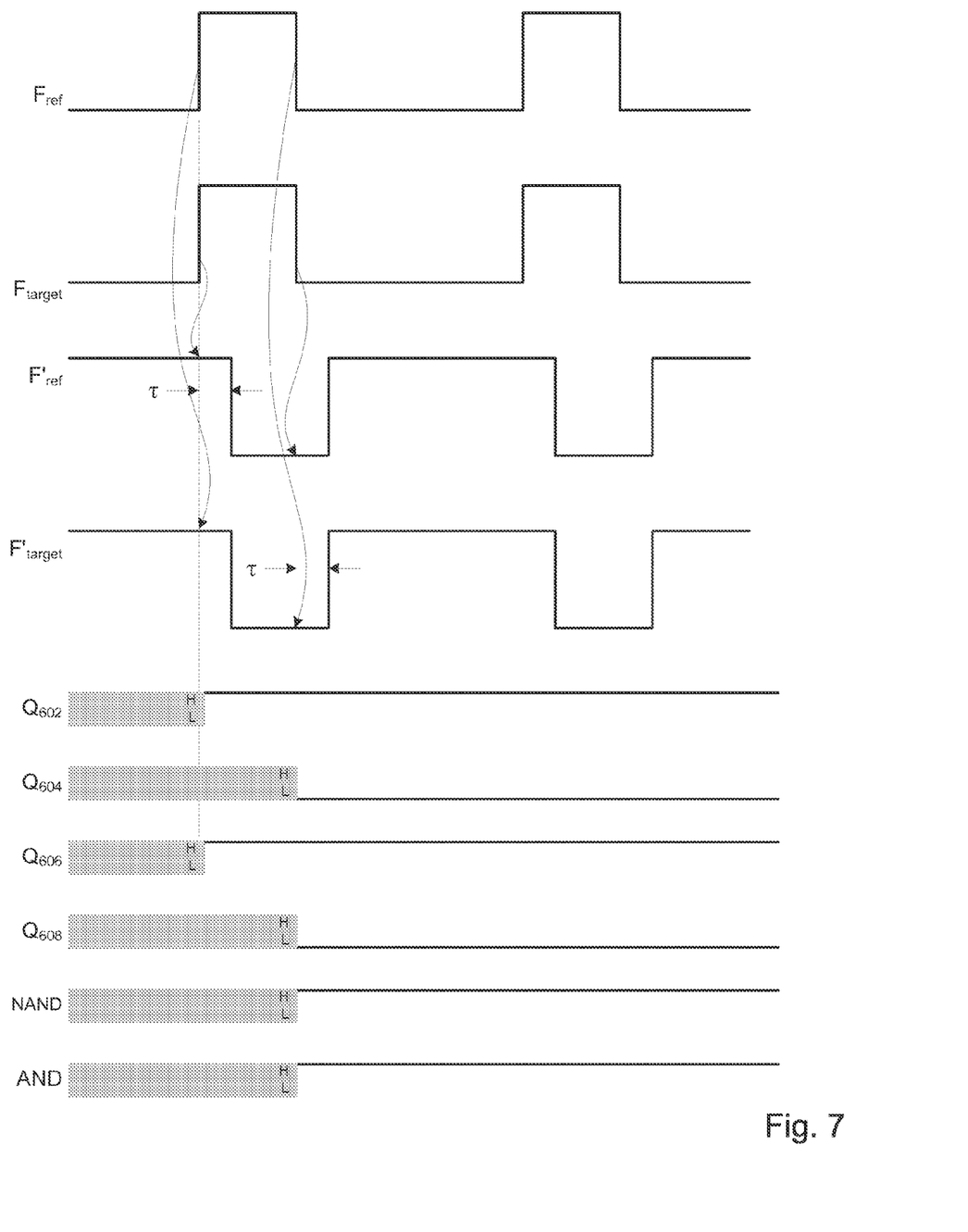
FIGS. 7-9 show timing diagrams for various phase relations between the reference signal and the target signal in accordance with principles of the present disclosure.

Operation of the lock detector 600 may be explained in connection with a timing diagram. Referring to FIG. 7, a timing diagram for the lock condition, where the target signal $F_{target}$ is locked to (i.e., in phase with) the reference signal $F_{ref}$, will be discussed. In this and subsequent figures, the shaded areas in the timing diagrams represent prior output states of the flip flops that depend on the previous phase relation of the signals $F_{ref}$ and $F_{target}$. However, since the figures do not show the details of the waveforms for $F_{ref}$ and $F_{target}$, the prior output states of the flip flops are not known and hence shaded.

The output $Q_{604}$ is "LO" when the flip flop 604 is triggered by the falling edge of the target signal $F_{target}$ because the signal level of the inverted signal $F_{ref}'$ is "LO" at the time of the trigger. Likewise, the output $Q_{608}$ is "LO" when the flip flop 608 is triggered by the falling edge of the reference signal $F_{ref}$ because the signal level of the inverted signal $F_{target}'$ is "LO" at the time of the trigger. Consequently, the output of NAND gate 614 is "HI".

The output $Q_{602}$ is "HI" when the flip flop 602 is triggered by the rising edge of the target signal $F_{target}$ because the signal level of the inverted signal $F_{ref}'$ is "HI" at the time of the trigger. Likewise, the output $Q_{606}$ is "HI" when the flip flop 606 is triggered by the rising edge of the reference signal $F_{ref}$ because the signal level of the inverted signal $F_{target}'$ is "HI" at the time of the trigger. Since all three inputs to the AND gate 616 are "HI", the AND gate asserts a "HI" level on the reset line 618b of the timing circuit 618.

Since the reset input of the counter 622 is an inverted input, the counter does not reset and continues to count at rate based on the frequency of the clock signal, which in the embodiment shown in FIG. 6 is the reference signal $F_{ref}$. When a period of time based on the maximum count value has passed, the counter 622 will assert a signal (e.g., "HI" level) on the output 618a of the timing circuit 618.

It can be appreciated that the period of time can be adjusted depending on how much time is desired to determine that a lock condition has been achieved. Referring to FIG. 1, during power up, the feedback signal $F_{fb}$ (i.e., the target signal) may enter into a period where its frequency fluctuates above and below the reference frequency (signal $F_{ref}$), and hence a lock has not been achieved. The period of time provided by the counter 622, therefore, should be long enough to avoid a false positive lock indication during those fluctuations.

It will be appreciated that timing charts similar to FIG. 7 can be used to arrive at the conclusion that other "no lock" (out of phase) conditions between $F_{ref}$ and $F_{target}$ will cause the timing circuit 618 to be held in a reset state. Thus, an out of phase condition between $F_{ref}$ and $F_{target}$ places the timing circuit 618 in reset and prevents it from timing out. The timing circuit 618 is enabled only when the $F_{target}$ is locked with $F_{ref}$, where the timing circuit 618 can time out so that lock detect signal can be asserted, thus indicating that the target signal $F_{target}$ is deemed to be locked to the reference signal $F_{ref}$. Consider, for example, FIG. 8 which shows a timing diagram of the lock detector 600 for the phase relation between $F_{ref}$ and $F_{target}$ shown in FIG. 4. As can be seen from the figure, the output of the AND gate 616 is "LO", which will hold the counter 622 in reset.

Figure 8:
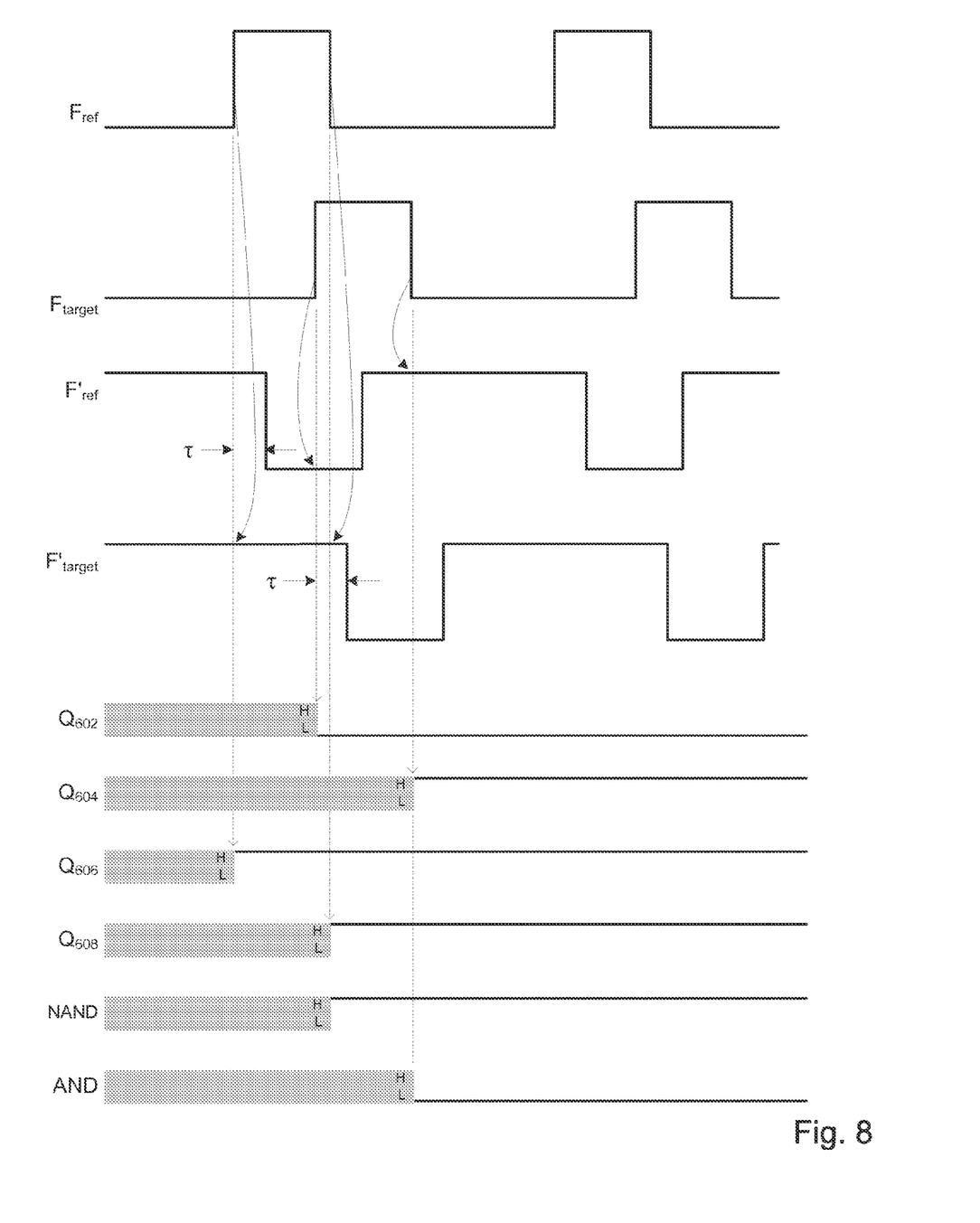
Figure 9:
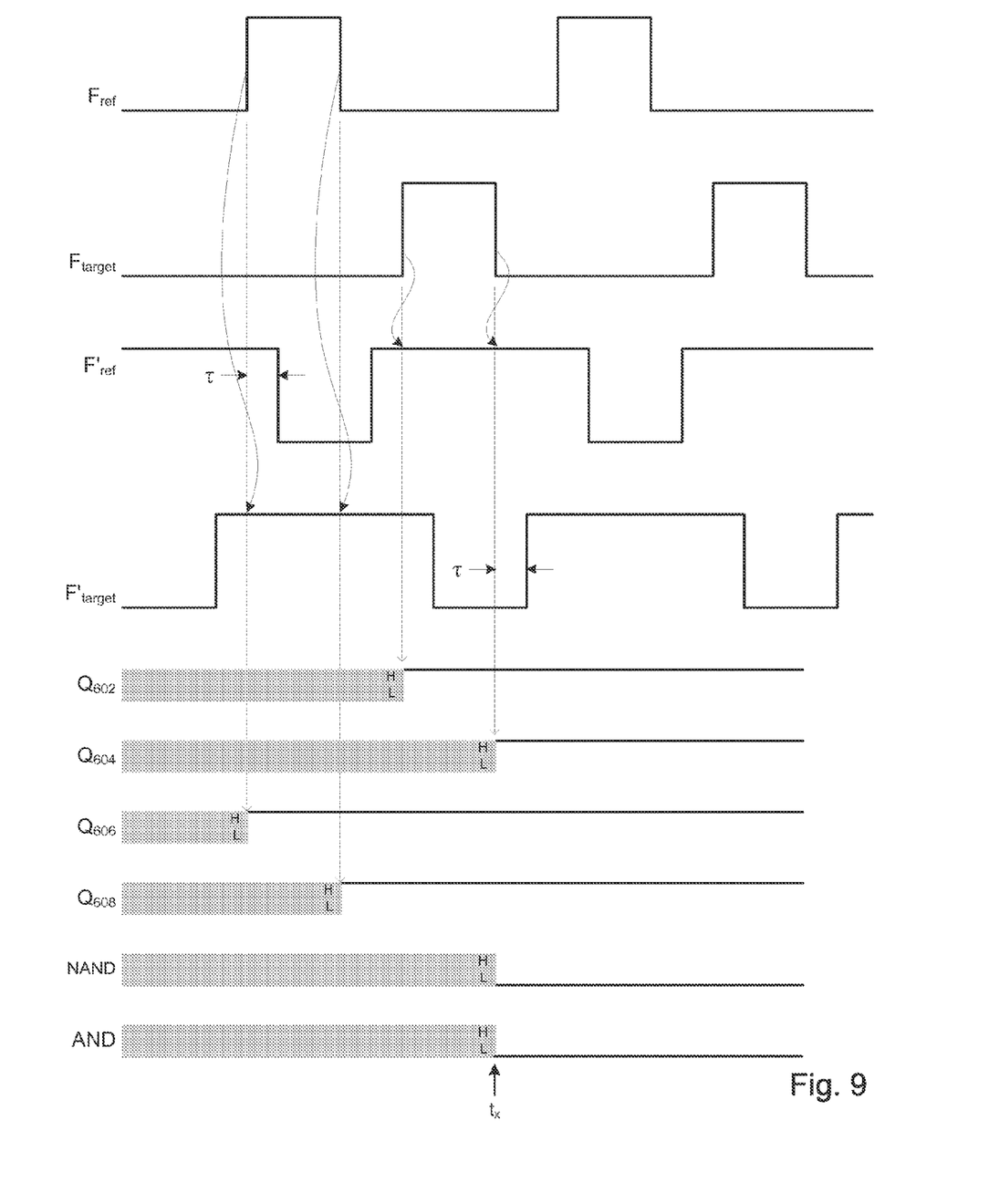

FIG. 9 shows a timing diagram of the lock detector 600 for the "no lock" situation shown in FIG. 5, where a conventional lock detector gave a false positive indication of a lock. As shown in the figure, at time t, the output of AND gate 616 outputs "LO" when the falling edge of the target signal $F_{target}$ clocks the inverted signal $F_{ref}'$. Referring back to FIG. 6, "LO" logic level at the output of AND gate 616 resets the counter 622 in the timing circuit 618. As can be seen in FIG. 8, the AND gate 616 will maintain a "LO" output for the given phase relationship between $F_{ref}$ and $F_{target}$, and thus will hold the counter 622 in reset. Consequently, where this no lock situation would have resulted in a false positive lock indication using the conventional lock detector 102 shown in FIG. 2, a lock detector in accordance with principles of the present disclosure will correctly indicate a no lock situation (e.g., by not asserting the lock detect signal).

Figure 10:
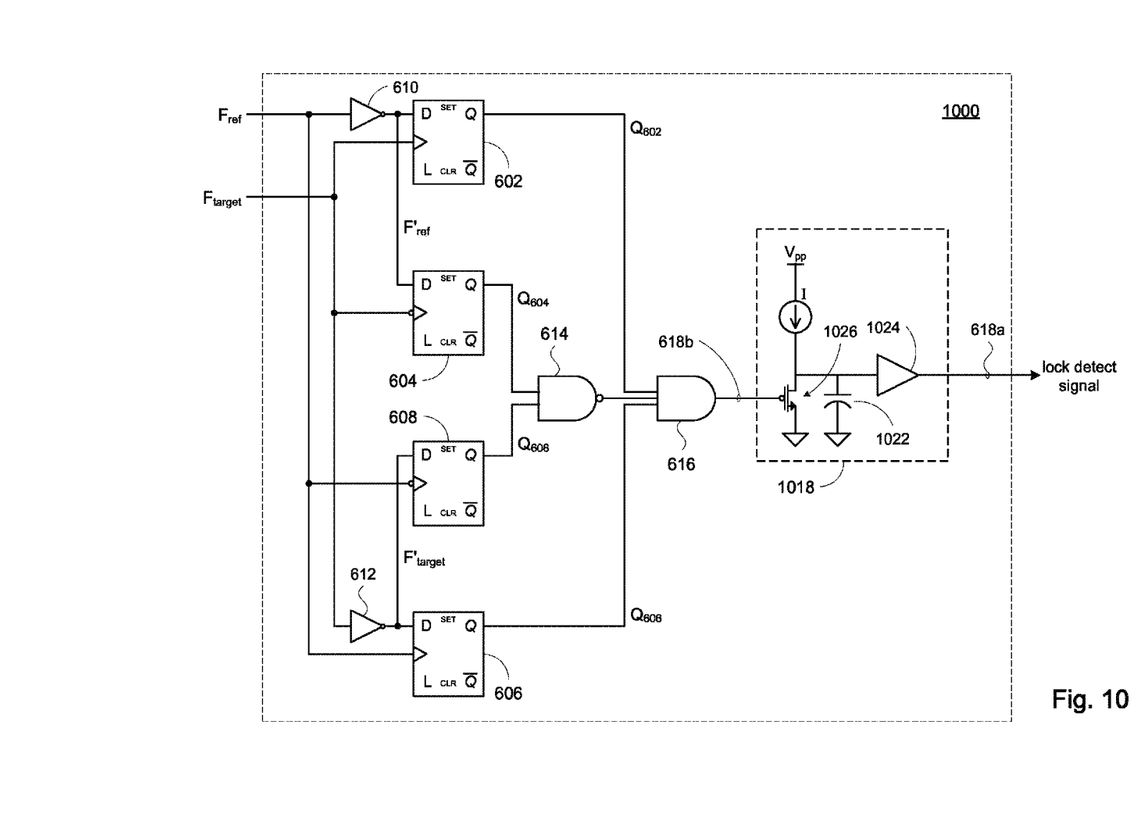
FIG. 10 shows an embodiment of a lock detector of the present disclosure using an analog-based timing circuit.

In FIG. 6, the lock detector 600 employs a timing circuit 618 comprising a counter 622, which in some embodiments is a digital circuit. In other embodiments, a lock detector in accordance with principles of the present disclosure may employ an analog-based timing circuit. Thus in some embodiments, such as illustrated in FIG. 10, a lock detector 1000 may include an analog timing circuit 1018. For example, the timing circuit 1018 may employ a circuit similar to the circuit 212 shown in FIG. 2. The initial state of the timing circuit 1018 may be a fully discharged capacitor 1022. When the capacitor 1022 charges to a level above a trigger level of the buffer 1024, the buffer will assert a signal that constitutes the lock detect signal. The timing circuit 1018 may be reset to the initial state when the output of AND gate 616 asserts a signal that turns ON transistor 1026 to discharge the capacitor 1022. The charge time of the capacitor 1022 is proportional to the current flow I into the capacitor and the capacitance of the capacitor. The timing diagrams discussed in connection with FIG. 6 apply to timing of the lock detector 1000.

The digital counter such as the counter 622 in FIG. 6 uses smaller components (and thus is more efficient in terms of area) and may consume less power than the analog counterpart. The digital counter is more easily configurable. For example, the time can be varied by removing or adding counting stages (typically a flip flop) to the counter 622 without significant impact silicon area. Nonetheless, it will be appreciated that a lock detector in accordance with the principles of the present disclosure may employ the analog-based timing circuit 1018 instead of a digital circuit.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present disclosure along with examples of how aspects of them may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the claims.

What is claimed is:

1. A method for determining whether first and second periodic signals are synchronized, the method comprising:
    sampling the first periodic signal based on a first edge pattern of the second periodic signal to generate a first set of samples;
    sampling the second periodic signal based on a second edge pattern of the first periodic signal to generate a second set of samples; and
    generating a lock signal indicating that the first and second periodic signals are synchronized in response to determining that the first set of samples and second set of samples correspond to the first and second edge patterns.

2. The method of claim 1, wherein the first edge pattern includes a first edge and second edge of the second periodic signal that are opposite in values, and wherein the second edge pattern includes a first edge and second edge of the first periodic signal that are opposite in values.

3. The method of claim 1, wherein sampling the first periodic signal comprises:
    generating a first value of the first periodic signal based on a first edge of the second periodic signal in the first edge pattern; and
    generating a second value of the first periodic signal based on a second edge of the second periodic signal in the first edge pattern.

4. The method of claim 3, wherein sampling the second periodic signal comprises:
    generating a third value of the second periodic signal based on a first edge of the first periodic signal in the second edge pattern; and
    generating a fourth value of the second periodic signal based on a second edge of the first periodic signal in the first edge pattern.

5. The method of claim 4 further comprising:
    comparing the first value with the third value to determine whether the first value matches the third value; and
    comparing the second value with the fourth value to determine whether the second value matches the fourth value, wherein the first set of samples and second set of samples match the first and second edge patterns when the first value matches the third value and the second value matches the fourth value.

6. The method of claim 1, wherein the first set of samples matches the first edge pattern when a value of one of the samples in the first set of samples corresponds to a value of an edge used to generate the sample.

7. The method of claim 1, wherein:
    sampling the first periodic signal comprises generating, based on a first edge of the second periodic signal, a first level representative of the first periodic signal; and
    sampling the second periodic signal comprises generating, based on a first edge of the second signal, a second level representative of the first periodic signal.

8. The method of claim 7 further comprising generating, based on at least one of a second edge of the first periodic signal and a second edge of the second periodic signal, a third level representative of at least one of the first periodic signal and the second periodic signal, wherein the lock signal is generated based on a combination of the first, second and third levels.

9. The method of claim 1, wherein the first and second periodic signals are clock signals.

10. The method of claim 1, wherein the first edge pattern includes a first plurality of adjacent edges and the second edge pattern includes a second plurality of adjacent edges.

11. A system for determining whether first and second periodic signals are synchronized, the system comprising control circuitry that:
    samples the first periodic signal based on a first edge pattern of the second periodic signal to generate a first set of samples;
    samples the second periodic signal based on a second edge pattern of the first periodic signal to generate a second set of samples; and
    generates a lock signal indicating that the first and second periodic signals are synchronized in response to determining that the first set of samples and second set of samples correspond to the first and second edge patterns.

12. The system of claim 11, wherein the first edge pattern includes a first edge and second edge of the second periodic signal that are opposite in values, and wherein the second edge pattern includes a first edge and second edge of the first periodic signal that are opposite in values.

13. The system of claim 11, wherein the control circuitry samples the first periodic signal by:
    generating a first value of the first periodic signal based on a first edge of the second periodic signal in the first edge pattern; and
    generating a second value of the first periodic signal based on a second edge of the second periodic signal in the first edge pattern.

14. The system of claim 13, wherein the control circuitry samples the second periodic signal by:

generating a third value of the second periodic signal based on a first edge of the first periodic signal in the second edge pattern; and generating a fourth value of the second periodic signal based on a second edge of the first periodic signal in the first edge pattern.

15. The system of claim 14, wherein the control circuitry:

compares the first value with the third value to determine whether the first value matches the third value; and compares the second value with the fourth value to determine whether the second value matches the fourth value, wherein the first set of samples and second set of samples match the first and second edge patterns when the first value matches the third value and the second value matches the fourth value.

16. The system of claim 11, wherein the first set of samples matches the first edge pattern when a value of one of the samples in the first set of samples corresponds to a value of an edge used to generate the sample.

17. The system of claim 11, wherein:

the control circuitry samples the first periodic signal by generating, based on a first edge of the second periodic signal, a first level representative of the first periodic signal; and the control circuitry samples the second periodic signal by generating, based on a first edge of the second signal, a second level representative of the first periodic signal.

18. The system of claim 17, wherein the control circuitry generates, based on at least one of a second edge of the first periodic signal and a second edge of the second periodic signal, a third level representative of at least one of the first periodic signal and the second periodic signal, wherein the lock signal is generated based on a combination of the first, second and third levels.

19. The system of claim 11, wherein the first and second periodic signals are clock signals.

20. The system of claim 11, wherein the first edge pattern includes a first plurality of adjacent edges and the second edge pattern includes a second plurality of adjacent edges.

* * * * *